(12) United States Patent
Chen et al.

(10) Patent No.: US 11,587,802 B2
(45) Date of Patent: Feb. 21, 2023

(54) SEMICONDUCTOR FABRICATION TOOL HAVING GAS MANIFOLD ASSEMBLED BY JIG

(71) Applicant: TAIWAN SEMICONDUCTOR MANUFACTURING CO., LTD., Hsinchu (TW)

(72) Inventors: Ming-Che Chen, Changhua County (TW); Wen-Tane Liao, Taichung (TW); Ming-Hsien Lin, Taichung (TW); Wei-Chen Liao, Nantou County (TW); Hai-Lin Lee, Taichung (TW); Chun-Yu Chen, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 107 days.

(21) Appl. No.: 16/749,286

(22) Filed: Jan. 22, 2020

(65) Prior Publication Data
US 2021/0134616 A1    May 6, 2021

Related U.S. Application Data

(60) Provisional application No. 62/928,036, filed on Oct. 30, 2019.

(51) Int. Cl.
*H01L 21/67* (2006.01)
(52) U.S. Cl.
CPC .. *H01L 21/67017* (2013.01); *H01L 21/67126* (2013.01)

(58) Field of Classification Search
CPC ......... H01L 21/67017; H01L 21/67126; H01L 21/6719; C23C 16/45561; C23C 16/45565; C23C 16/4557
See application file for complete search history.

(56) References Cited

U.S. PATENT DOCUMENTS

| 4,604,540 A | * | 8/1986 | Fukami | H02K 23/56 310/154.06 |
| 6,047,480 A | * | 4/2000 | Powers | H01L 21/68 33/613 |

(Continued)

FOREIGN PATENT DOCUMENTS

| EP | 1714784 A2 * | 10/2006 | ............ B41F 27/04 |
| JP | H07279984 A * | 10/1995 | |

(Continued)

*Primary Examiner* — Jarrett J Stark
(74) *Attorney, Agent, or Firm* — Birch, Stewart, Kolasch & Birch, LLP

(57) ABSTRACT

A method of processing a semiconductor wafer is provided. The method includes installing upper lid. The installation of the upper lid includes placing an inlet manifold on a water box; inserting a jig into a lower gas channel in the water box and inserting into an upper gas channel in the inlet manifold; fastening the water box to the inlet manifold; and removing the jig after the water box engaging with the inlet manifold. The method also includes connecting a shower head on a lower side of the water box; and connecting the upper lid to a housing. The method further includes placing a semiconductor wafer into the housing. In addition, the method includes supplying a process gas over the semiconductor wafer through the upper gas channel, the lower gas channel and the shower head.

20 Claims, 12 Drawing Sheets

(56) References Cited

U.S. PATENT DOCUMENTS

| | | | |
|---|---|---|---|
| 6,381,021 B1* | 4/2002 | Somekh | G01N 21/55 356/445 |
| 11,251,035 B2* | 2/2022 | Blanquart | H01L 21/0337 |
| 2002/0051321 A1* | 5/2002 | Takagi | G11B 5/4833 360/245.2 |
| 2006/0061102 A1* | 3/2006 | Wilkinson, III | F16L 39/005 285/412 |
| 2007/0119371 A1* | 5/2007 | Ma | H01J 37/32449 118/715 |
| 2008/0083109 A1* | 4/2008 | Shibata | H01L 21/67126 422/198 |
| 2009/0014897 A1* | 1/2009 | Ohno | H01L 23/49816 257/778 |
| 2010/0003406 A1* | 1/2010 | Lam | C23C 16/45536 427/255.391 |
| 2012/0279371 A1* | 11/2012 | Mulchi, Jr. | A22C 17/006 83/821 |
| 2014/0173873 A1* | 6/2014 | Butterfield, IV | B25C 3/008 29/407.09 |
| 2017/0306488 A1* | 10/2017 | Yao | C23C 16/4404 |
| 2019/0015938 A1* | 1/2019 | Brantley | B23K 37/0531 |
| 2019/0101679 A1* | 4/2019 | Kitamura | G02F 1/133621 |
| 2020/0130071 A1* | 4/2020 | Muto | B23C 3/12 |
| 2021/0112982 A1* | 4/2021 | Iellimo | B65G 1/02 |

FOREIGN PATENT DOCUMENTS

| | | | | |
|---|---|---|---|---|
| JP | 2007019375 A | * | 1/2007 | |
| JP | 2016188133 A | * | 11/2016 | |
| KR | 20070042270 A | * | 4/2007 | |
| KR | 20080027459 A | * | 3/2008 | H01L 21/76873 |
| KR | 20130062937 A | * | 6/2013 | C23C 16/505 |

\* cited by examiner

SEMICONDUCTOR FABRICATION TOOL HAVING GAS MANIFOLD ASSEMBLED BY JIG

PRIORITY CLAIM AND CROSS-REFERENCE

This application claims priority to U.S. Provisional Application Ser. No. 62/928,036, filed Oct. 30, 2019, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

One broad category of commonly used techniques employed to form material layers and alter properties over semiconductor wafers is deposition, which includes the techniques such as chemical vapor deposition, physical vapor deposition, sputtering, ion implantation, etc. Although existing fabrication tool and methods for producing or depositing material layers on the semiconductor wafer have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
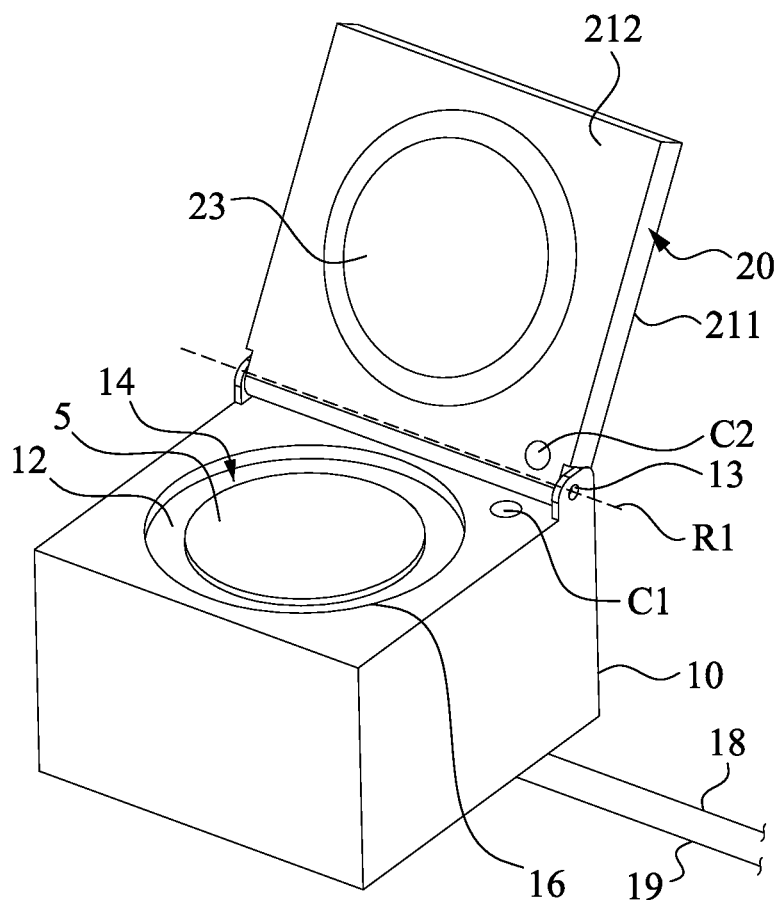
FIG. 1 shows a schematic view of a wafer fabrication tool, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Film deposition process is extensively used in the semiconductor industry for fabricating integrated circuits on semiconductor wafers. The deposition is generally performed in a reactive chamber. Inside the chamber, a reactant gaseous material for film formation is introduced through a shower head over the semiconductor wafer. Non-uniformity of a gaseous material distribution in the chamber may reduce film uniformity on the semiconductor wafer and thereby reducing the chip yield in the semiconductor fabrication. To address this issue, the present disclosure is directed to an installation method for a gas manifold in semiconductor fabrication tool that decreases misalignment of two neighboring gas channels. The fabrication tool and the related method are provided to increase uniformity of plasma or gaseous material emitted from the shower head, and ultimately increase the uniformity of films deposited in a film deposition process and other semiconductor processes.

FIG. 1 shows a schematic view of a wafer fabrication tool 1 for performing CVD process on semiconductor wafer 5 in accordance with some embodiments. However, the wafer fabrication tool 1 is not limited to perform CVD process and may be used wherever a gaseous material is supplied to a chamber and passes through a surface of the semiconductor wafer 5. For example, the wafer fabrication tool 1 may be a system for performing plasma enhanced CVD (PECVD), physical vapor deposition (PVD) or atomic layer deposition (ALD), or any other process step in semiconductor fabrication. Examples of related applications include but are not limited to formation of films of shallow trench isolation (STI), advanced patterned film/antireflective coating (APF/ARC) oxide, and low dielectric constant materials.

The semiconductor wafer 5 to be processed by the wafer fabrication tool 1 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the wafer fabrication tool 1 includes a housing 10 and an upper lid 20. Additional features can be added to the wafer fabrication tool 1. Some of the features described below can be replaced or eliminated for additional embodiments of the wafer fabrication tool 1.

The housing 10 has a process chamber 14 inside, and the process chamber 14 has an upper opening 16. A wafer chuck 12 is disposed in the process chamber 14 for supporting a semiconductor wafer 5 to be processed. The wafer chuck 12 faces the upper opening 16 of the process chamber 14. In some embodiments, the wafer chuck 12 is an electrostatic chuck (ESC), a vacuum chuck or a mechanical chuck configured to secure the semiconductor wafer 5 thereon. In some embodiments, the wafer chuck 12 includes one or more heaters (e.g., resistive heating elements not shown in figures) for heating the semiconductor wafer 5 during wafer processing. In some embodiments, the wafer chuck 12 is a rotary or rotatable chuck that is supported on a shaft for rotational movement as the shaft is driven by a motor.

In some embodiments, a gas supply line 18 is connected to the housing 10 and is configured to supply gaseous material into the housing 10 for a wafer processing which is performed in the process chamber 14. Examples of processing include, but are not limited to, film deposition, ion implantation, etching and cleaning. In at least one embodiment, the gaseous material includes a vapor of at least one material which is normally in a liquid or solid state. For example, the gaseous material includes cobalt containing gas composition. Alternatively or additionally, the gaseous material includes at least one material which is normally in the gaseous state. In at least one embodiment, the gaseous material includes ions generated, for example, by a plasma for a plasma process to be performed in the process chamber 14. Examples of plasmas processes include, but are not limited to, plasma enhanced film deposition, plasma etch and plasma photoresist strip (PR strip). Examples of plasmas enhanced film deposition include, but are not limited to, plasma enhanced chemical vapor deposition (PECVD) and plasma enhanced atomic layer deposition (PEALD). To generate ions included in the gaseous material, a plasma power source, e.g., one or more spiral coils, is provided inside or outside the process chamber 14. In at least one embodiment where the plasma power source is provided outside the process chamber 14, the generated ions are included in the flow of gaseous material entering the process chamber 14 via the gas supply line 18. In at least one embodiment where the plasma power source is provided inside the process chamber 14, the flow of gaseous material entering the process chamber 14 via the gas supply line 18 does not include ions, and the plasma power source is provided downstream of the gas supply line 18 to generate ions inside the process chamber 14. In at least one embodiment, the processing to be performed in the process chamber 14 does not involve a plasma, and the gaseous material no ions both outside and inside the process chamber 14. Other arrangements are within the scope of various embodiments.

In some embodiments, the upper lid 20 is pivotally connected to the housing 10 via a hinge 13 mounted on the housing 10. The upper lid 20 can be rotated about a rotation axis R1 so as to close the upper opening 16 of the process chamber 14. In some embodiments, when the upper lid 20 is closed, an airtight environment of the process chamber 14 is established. The gaseous material from the gas supply line 18 may be supplied into the airtight process chamber 14 through a number of continuously extended gas channels, such as channel C1 extending in the housing 10 and gas channel C2 extending in the upper lid 20 and discharged over the semiconductor wafer 5 through a shower head 23 located above the wafer chuck 12. Details for supplying the gaseous material into the process chamber 14 will be described later. In some embodiments, the process chamber 14 is also connected to an exhaust conduit 19, and a vacuum may be produced in the process chamber 14 by pumping out gaseous material or particles in the process chamber 14 through the exhaust conduit 19. The pumped out gaseous material may be processed by a gas-handling system (not shown in figure) for removing particles in the gaseous material or cooling the gaseous material.

In accordance with some embodiments, structural features of the upper lid 20 are described below.

Figure 2:
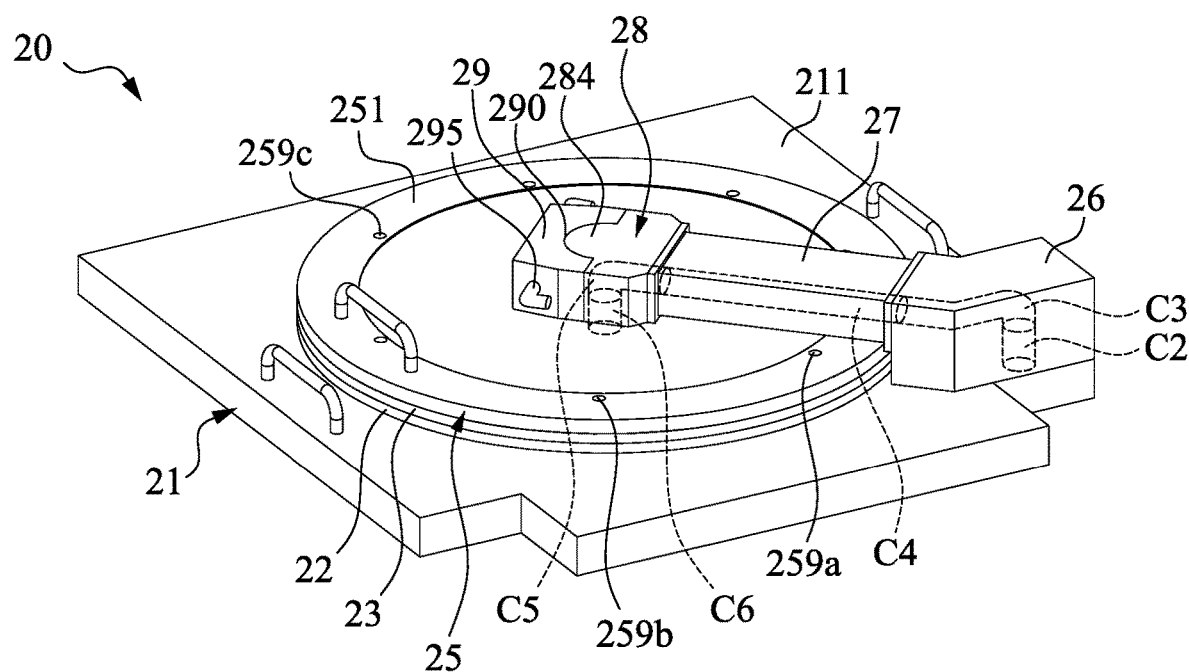
FIG. 2 shows a schematic view of an upper lid of a wafer fabrication tool, in accordance with some embodiments.
Figure 3:
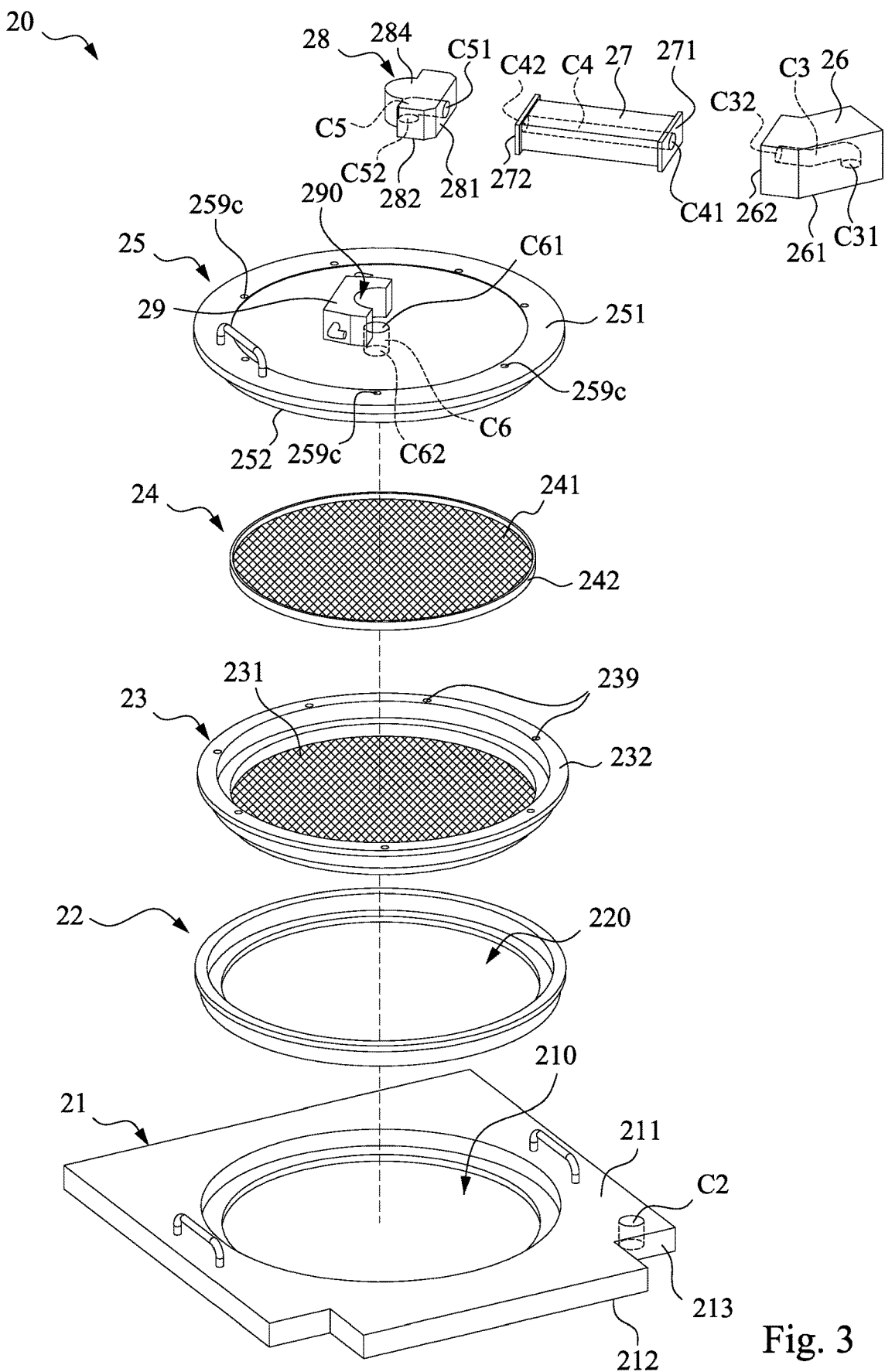
FIG. 3 shows an exploded view of an upper lid of a wafer fabrication tool, in accordance with some embodiments.
Figure 4:
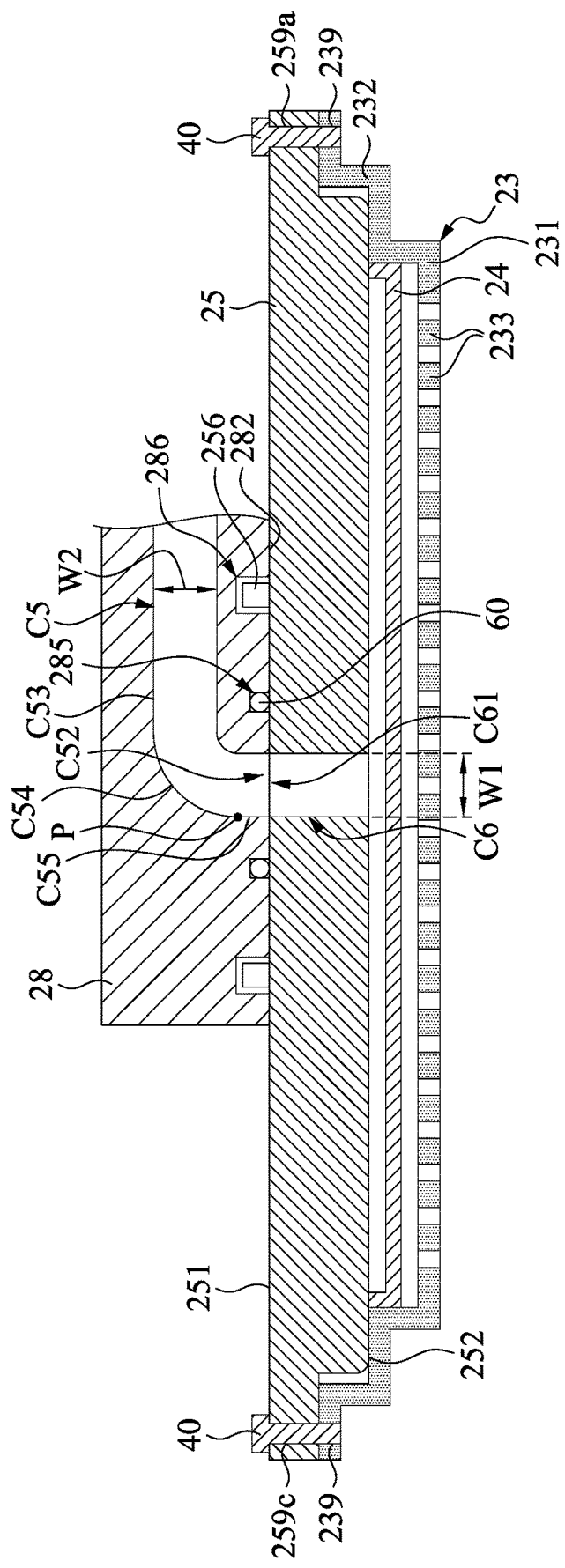
FIG. 4 shows a cross-sectional view of partial elements of an upper lid of a wafer fabrication tool, in accordance with some embodiments.

FIG. 2 shows a schematic view of the upper lid 20, in accordance with some embodiments. FIG. 3 shows an exploded view of the upper lid 20, in accordance with some embodiments. FIG. 4 shows a cross-sectional view of partial elements of the upper lid 20, in accordance with some embodiments. The cross-sectional view in FIG. 4 is taken along a longitudinal axis of a connector 27 shown in FIG. 2, excepted for inlet manifold 28 and O-ring 60, other elements placed above the water box 25 are ignored for purpose of clarity.

In some embodiments, the upper lid 20 includes a lid plate 21, an insulator 22, a shower head 23, a block plate 24, a water box 25, an outlet manifold 26, a connector 27, an inlet manifold 28, and a water manifold 29. The elements of the upper lid 20 can be added to or omitted, and the invention should not be limited by the embodiment.

As shown in FIG. 3, the lid plate 21 has a plate-like shape and has an upper surface 211 and a lower surface 212. A circular opening 210 is formed in a center of the lid plate 21 for receiving the shower head 23. The opening 210 penetrates the upper surface 211 and the lower surface 212. In some embodiments, a gas channel C2 is formed in a corner of the lid plate 21 for guiding gaseous material from the housing 10. In some embodiments, the gas channel C2 is located adjacent to a lateral side 213 of the lid plate 21 which is hinged to the housing 10 and is aligned with the gas channel C1 (see FIG. 1) of the housing 10. The gas channel C2 may be vertically extended and penetrates the upper surface 211 and the lower surface 212. The insulator 22 surrounds an edge of the opening 210 to electrically and/or thermally insulate the shower head 23 and the lid plate 21 so as to protect an operator of the wafer fabrication tool 1 from being hurt. The insulator 22 may be made of insulation material such as ceramic or silicon rubber.

The shower head 23 and the block plate 24 are configured to evenly distribute gaseous material into the process chamber 14 (see FIG. 1). In some embodiments, the shower head 23 includes a lower wall 231 and a side wall 232. The side wall 232 surrounds an outer edge of the lower wall 231 and extends upwardly from the lower wall 231 to define a space for receiving the block plate 24. A number of through holes 233 (see FIG. 4) are formed on the lower wall 231 for discharging gaseous material. A number of thread holes 239 are formed on a top surface of the side wall 232. The thread holes 239 may be spaced from one another by the same angle of circumference.

The block plate 24 is surrounded by the side wall 232 and connected to a lower side 252 of the water box 25. In some embodiments, the block plate 24 includes a membrane 241 and a support ring 242. The membrane 241 is connected to a lower edge of the support ring 242, and an upper edge of the support ring 242 is connected to the lower side 252 of the water box 25. Both the membrane 241 and the through holes 233 of the shower head 23 function, in at least one embodiment, to further distribute the dispersed gaseous material uniformly across the wafer and/or to reduce the impact of the dispersed gaseous material with the wafer. In some embodiments, the materials suitable for the shower head 23 and the block plate 24 are anodized aluminum, aluminum alloy, ceramic, and other corrosion resistant materials. In some embodiments, the block plate 24 omitted. The gaseous material is evenly distributed by the shower head 23.

The water box 25 is located above the shower head 23 and configured to regulate temperature of the upper lid 20. The water box 25 is used because the process in the process chamber 14 (see FIG. 1) is typically performed at elevated temperatures within heated controlled environments. Thus, the upper lid 20 is heated by circulating a warm liquid, such as water, into the water box 25 so as to avoid the loss of heat through the upper lid 20 and adversely affect the process. In some embodiments, as shown in FIG. 2, the water manifold 29 is fixed on an upper side 251 of the water box 25. Fluid path of the water manifold 29 and the fluid path of the water box 25 are fluidly communicated to each other. Warm liquid may be delivered into the water box 25 or discharged from the water box 25 via one or more nozzle, such as nozzle 295, connected to the water manifold 29.

Figure 5:
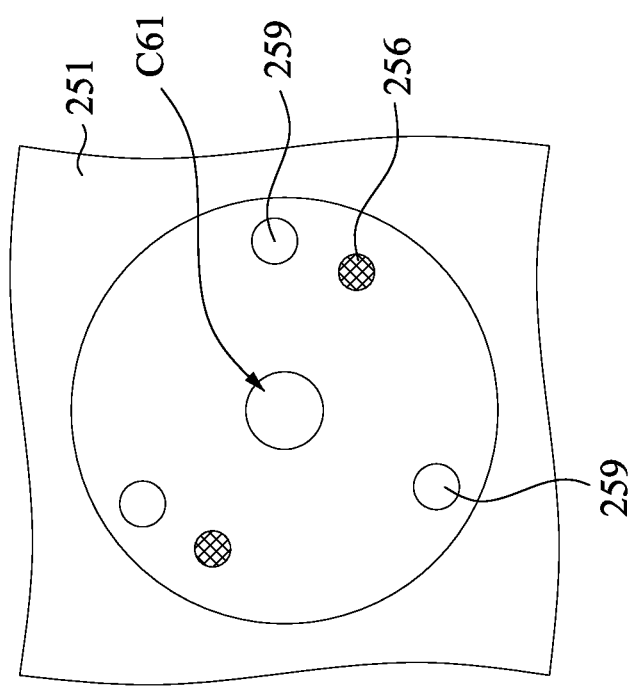
FIG. 5 shows a top view of partial elements of a water box, in accordance with some embodiments.

In some embodiments, as shown in FIG. 5, a number of thread holes, such as thread holes 259a, 259b and 259c, are arranged in a peripheral region of the water box 25. The number of the thread holes 259a, 259b and 259c of the water box 25 corresponds to the number of the thread holes 239 (see FIG. 3) of the shower head 23. In addition, each of the thread holes 259a, 259b and 259c of the water box 25 is arranged with respect to one of the thread holes 239 of the shower head 23. The thread holes 259a, 259b and 259c of the water box 25 and the thread holes 239 of the shower head 23 may be connected to each other by a number of screws 40, as shown in FIG. 4.

In some embodiments, a gas channel C6 is formed in the water box 25 for facilitating the delivery of the gaseous material into the process chamber 14. In some embodiments, as shown in FIG. 3, the gas channel C6 vertically extends in the water box 25 and penetrates the upper side 251 and the lower side 252 of the water box 25. An upstream opening C61 of the gas channel C6 is formed on the upper side 251 of the water box 25, and a downstream opening C62 is formed on the lower side 252 of the water box 25. The gas channel C6 may be arranged in respect to a center of the water box 25. For example, the water box 25 has a round shape, and the gas channel C6 is formed on a center of the water box 25. In some embodiments, the water manifold 29 is located adjacent to the gas channel C6 and has a notch 290 partially surrounds an upstream opening C61 of the gas channel C6. In some embodiments, the width W1 of the gas channel C6 is in a range of about 5 mm to about 10 mm, for example 9.6 mm. The gas channel C6 has a smooth inner wall and has a circular cross section.

In some embodiments, as shown in FIG. 3, each of the outlet manifold 26, the connector 27 and the inlet manifold 28 has its own gas channel for facilitating the delivery of the gaseous material. For example, the outlet manifold 26 has a gas channel C3 formed therein. An upstream opening C31 of the gas channel C3 is formed on a bottom surface 261 of the outlet manifold 26, and a downstream opening C32 is formed on a side surface 262 of the outlet manifold 26. The connector 27 has a gas channel C4 formed therein. An upstream opening C41 of the gas channel C4 is formed on an end surface 271 of the connector 27, and a downstream opening C42 is formed on an end surface 272 of the connector 27. The inlet manifold 28 has a gas channel C5 formed therein. An upstream opening C51 of the gas channel C5 is formed on a side surface 281 of the inlet manifold 28, and a downstream opening C52 is formed on the bottom surface 282 of the inlet manifold 28. Each of the gas channel C2, the gas channel C3, the gas channel C4, the gas channel C5 and the gas channel C6 may be formed with a circular cross section and has a uniform diameter.

In some embodiments, referring to FIG. 2, the outlet manifold 26, the connector 27 and the inlet manifold 28 are arranged in a manner of the gas channels C3-C5 are sequentially linked. Specifically, the bottom surface 261 of the outlet manifold 26 is connected to the upper surface 211 of the lid plate 21 to have the gas channel C2 engaged with the upstream opening C31 of the gas channel C3. The side surface 262 of the outlet manifold 26 is connected to the end surface 271 of the connector 27 to have the downstream opening C32 of the gas channel C3 engaged with the upstream opening C41 of the gas channel C4. The end surface 272 of the connector 27 is connected to the side surface 281 of the inlet manifold 28 to have the downstream opening C42 of the gas channel C4 engaged with the upstream opening C51 of the gas channel C5. The bottom surface 282 of the inlet manifold 28 is connected to the upper side 251 of the water box 25 to have the downstream opening C52 of the gas channel C5 engaged with the upstream opening C61 of the gas channel C6. As a result, the gas channel C2, the gas channel C3, the gas channel C4, the gas channel C5 and the gas channel C6 are linked.

In some embodiments, as shown in FIG. 4, the gas channel C5 has multiple segments, such as first segment C53, second segment C54 and third segment C55. The first segment C53 extends in a direction substantially parallel to the upper side 251 of the water box 25. The third segment C55 connected to the downstream opening C52 and extends in a direction substantially perpendicular to the upper side 251 of the water box 25. The second segment C54 has a curved configuration and connects the first segment C53 to the third segment C55. The second segment C54 interferes with the third segment C55 at a point P.

In some embodiments, as shown in FIG. 3, the inlet manifold 28 has a protrusion 284 formed opposite to the side surface 281. The protrusion 284 is formed to conform to the shape of the notch 290. When the inlet manifold 28 is connected to the water box 25, the protrusion 284 is located inside the notch 290. Since the water manifold 29 are fixed on the upper side 251 of the water box 25, the notch 290 can be used to help the inlet manifold 28 place on the water box 25 in a correct direction. As a result, assembly efficiency is improved.

Figure 6:
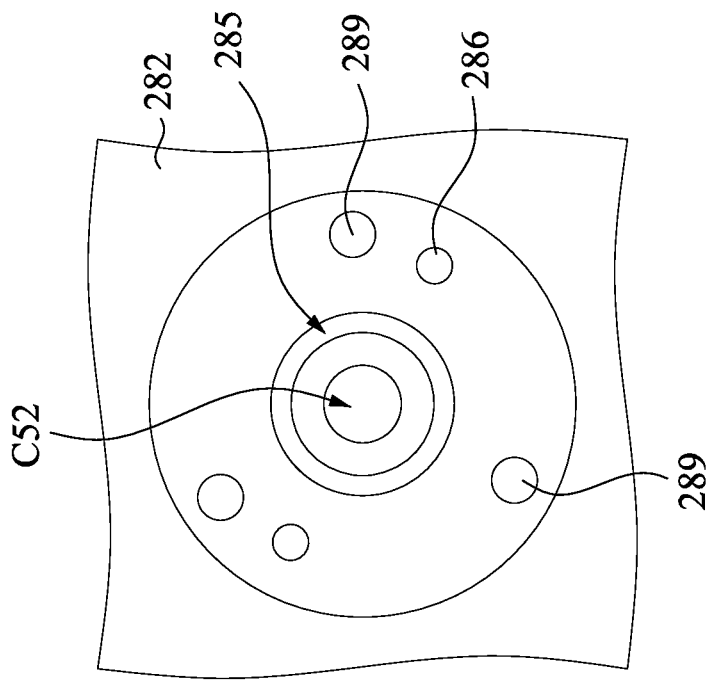
FIG. 6 shows a bottom view of partial elements of an inlet manifold, in accordance with some embodiments.

In addition to the notch 290, other features may be utilized to facilitate the alignment of the inlet manifold 28 and the water box 25. For example, as shown in FIGS. 4-6, one or more pins, for example two pins 256, are formed on the upper side 251 of the water box 25, and one or more positioning holes, for example two positioning holes 286 are formed on the bottom surface 282 of the inlet manifold 28. The pins 256 are formed to conform to the shape of the positioning holes 286 and are arranged in respected to the positioning holes 286. When the inlet manifold 28 is connected to the water box 25, the pins 256 are inserted into the positioning holes 286. It will be appreciated that although FIG. 4 illustrates two pins 256 to connect to two positioning holes 286, the upper lid 20 can include any number of pins 256 to connect to any number of positioning holes 286. In addition, the position of the pins and the positioning holes can be exchanged. For example, the pins 256 are formed on the bottom surface 282 of the inlet manifold 28 and the positioning holes 286 are formed on the upper side 251 of the water box 25. In some embodiments, the pin 256 and the positioning holes 286 are omitted.

In some embodiments, to prevent a leakage of gaseous material to outside of the gas channels through a gap formed between the inlet manifold 28 and the water box 25, an O-ring 60 is placed between the inlet manifold 28 and the water box 25. The O-ring 60 may be placed in a recess 285 formed on bottom surface 282 of the inlet manifold 28. The recess 285 surrounds the downstream opening C52 of the gas channel C5, and the O-ring 60 may be placed with respect to a center of the downstream opening C52.

In some embodiments, the inlet manifold 28 is fastened to the water box 25 via a number of fastening members, such as screws (not shown in figures). In some embodiments, as shown in FIGS. 5 and 6, a number of thread holes, such as three thread holes 259a, 259b and 259c are arranged around the upstream opening C61, and a number of thread holes, such as three thread holes 289 are arrange around the downstream opening C52. With the guiding of the notch 290 (see FIG. 3) and the pins 256, the three thread holes 259a, 259b and 259c would quickly align with three thread holes 289 when the inlet manifold 28 is placed on the water box 25.

Figure 7:
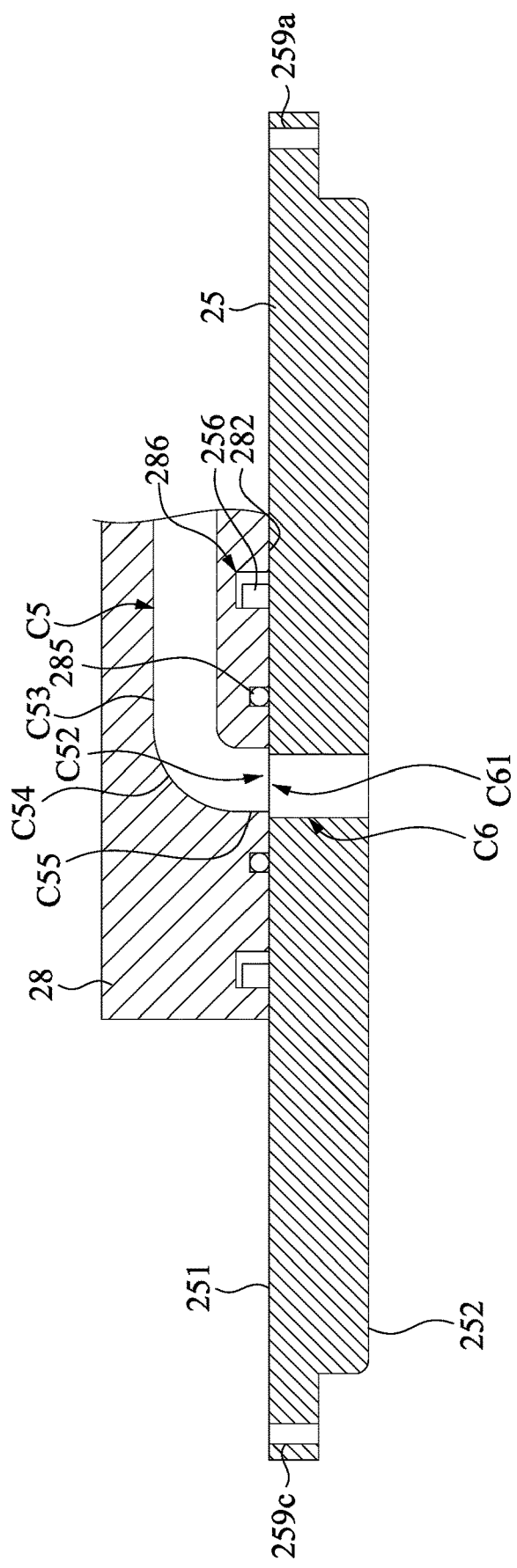
FIG. 7 shows s a cross-sectional view of partial elements of an upper lid of a wafer fabrication tool in which an upper gas channel is misaligned with a lower gas channel, in accordance with some embodiments.

However, as shown in FIG. 7, in some embodiments, when the inlet manifold 28 is placed on the water box 25, a misalignment of the gas channel C5 and the gas channel C6 occurs, which may result from a manufacturing tolerance of the pins 256 and/or the positioning holes 286. Excessive offset of the gas channel C5 and the gas channel C6 may cause turbulence when the gaseous material passes therethrough.

To address above-mentioned issue the present disclosure provides the following installation method S100 for the inlet manifold 28 to the water box 25.

Figure 8:
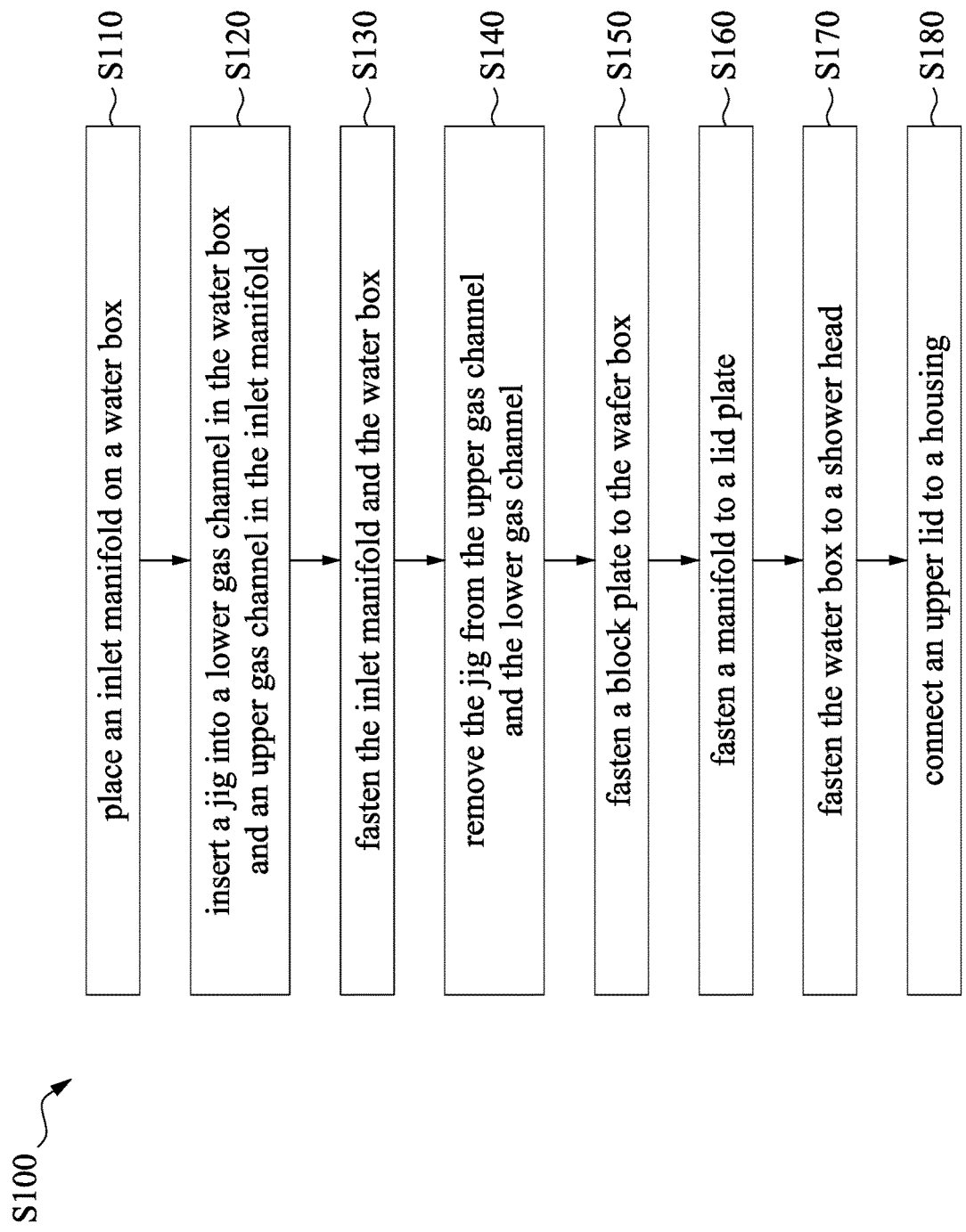
FIG. 8 shows a flow chart of a method of installing a wafer fabrication tool, in accordance with some embodiments.

FIG. 8 shows a flow chart illustrating a method S100 for installation the wafer fabrication tool 1, in accordance with some embodiments. For illustration, the flow chart will be described along with the drawings shown in FIGS. 9-12. Additional operations can be provided before, during, and after the method S100, and some of the operations described can be replaced or eliminated for other embodiments of the method. In the following descriptions, the gas channel C5 in the inlet manifold 28 is referred to as "upper gas channel", and the gas channel C6 in the water box 25 is referred to as "lower gas channel" for clarity.

Figure 9:
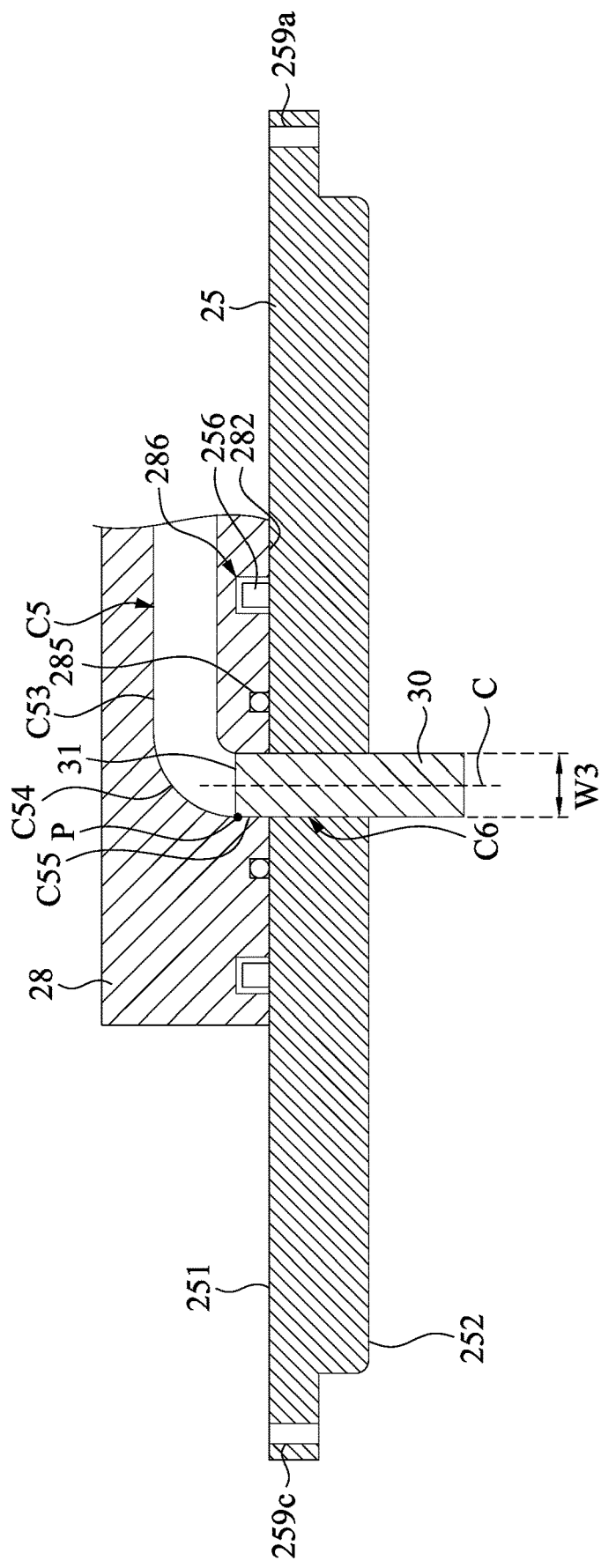
FIG. 9 shows a schematic view of a stage of a method of installing a wafer fabrication tool in which a jig is inserted into a lower gas channel and an upper gas channel, in accordance with some embodiments.

The method S100 includes operation S110, in which the inlet manifold 28 is placed on the water box 25. In some embodiments, as shown in FIG. 9, the inlet manifold 28 is placed on the upper side 251 of the water box 25. Before the inlet manifold 28 is placed on the upper side 251 of the water box 25, an O-ring 60 may be placed therebetween to prevent gas leakage. Additionally, the inlet manifold 28 may be engaged with the connector 27 and the outlet manifold 26 in advance, such that the inlet manifold 28 along with the connector 27 and the outlet manifold 26 are placed over the water box 25 in the same time. The operation S110 may be assisted by the guiding of the notch 290 and the pins 258.

The method S100 also includes operation S120, in which a jig 30 is inserted into the lower gas channel C6 and the upper gas channel C5. In some embodiments, as shown in FIG. 9, in order to allow the insertion of the jig 30 into the lower gas channel C6 and the upper gas channel C5, the block plate 24 and the shower head 23 are removed from the lower side 252 of the water box 25. The jig 30 is inserted into the lower gas channel C6 through the downstream opening C62 and passes through the upstream opening C61 and the downstream opening C52.

In some embodiments, the jig 30 includes a cylinder and has a length greater than a distance between the point P and the lower side 252 of the water box 25. Therefore, after the jig 30 is inserted into the upper gas channel C5, an end 31 of the jig 30 abuts against a lower end of the third segment C54 of the upper gas channel C5. In other words, the end 31 of the jig 30 abuts against the point P at which the third segment C55 of the upper gas channel C5 connected to the second segment C54 of the upper gas channel C5. In addition, the other end of the jig 30 is exposed by the lower gas channel C6. In some embodiments, the jig 30 is made of pliable material such as polytetrafluoroethene (PTFE), so as to avoid a scratch formed on the inner wall of the upper gas channel C5 resulting from the insertion of the jig 30.

In addition, the jig 30 has a diameter W3 substantially the same or slightly less than a width W2 (see FIG. 4) of the upper gas channel C5 and the width W1 (see FIG. 4) of the lower gas channel C6. As a result, after the jig 30 is inserted into the upper gas channel C5, the position of the inlet manifold 28 is adjusted by the jig 30 to allow the third segment C55 of the upper gas channel C5 to align with the lower gas channel C6. In some embodiments, the moving distance of the inlet manifold 28 relative to the water box 25 is less than a width difference between the pin 256 and the corresponding positioning hole 286. In some embodiments, the diameter of the jig 30 is slightly greater than a diameter of the upper gas channel C5 and the lower gas channel C6, and the jig 30 is squeezed into the lower gas channel C6 and the upper gas channel C5 to allow central alignment gas channels.

In some embodiments, the alignment of the upper gas channel C5 and the lower gas channel C6 represents a center of the downstream opening C52 of the upper gas channel C5 and a center of the upstream opening C61 of the lower gas channel C6 being arranged along the central axis C as shown in FIG. 9, the central axis C is perpendicular to the lower side 252 of the water box 25. In some embodiments, the alignment of the upper gas channel C5 and the lower gas channel C6 represents an inner wall of the third segment C55 of the upper gas channel C5 is flush with an inner wall of the lower gas channel C6.

The method S100 also includes operation S130, in which the inlet manifold 28 is fastened to the water box 25. In some embodiments, the inlet manifold 28 is fastened to the water box 25 by the use of a number of fastening members, such as screws (not shown in figures), to connect the thread holes 259 and 289. In some embodiments, the operation S130 is performed while the jig 30 stays in the upper gas channel C5 and the lower gas channel C6. After the inlet manifold 28 is fastened to the water box 25, the method S100 continues with operation S140 to remove the jig 30 from the upper gas channel C5 and the lower gas channel C6. However, it should be appreciated that many variations and modifications can be made to embodiments of the disclosure. In some other embodiments, the operation S130 is performed after the removal of the jig 30 from the upper gas channel C5 and the lower gas channel C6.

Figure 10:
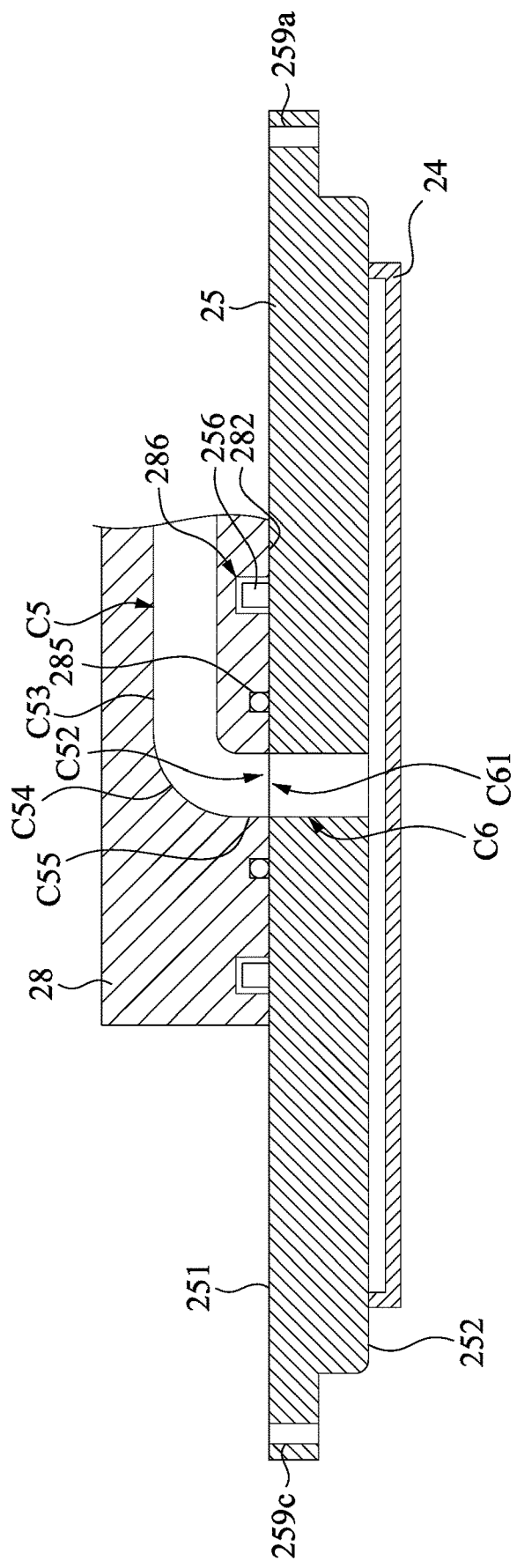
FIG. 10 shows a schematic view of a stage of a method of installing a wafer fabrication tool in which a block plate is fixed on a water box, in accordance with some embodiments.

The method S100 also includes operation S150, in which the block plate 24 is fastened to the lower side 252 of the water box 25, as shown in FIG. 10. The block plate 24 is fastened to the lid plate 21 by a number of fastening members, such as screws (not shown in figures). The block plate 24 covers the gas channel C6. In some embodiments, the insulator 22 and the shower head 23 are fixed on the lid plate 21 before operation S150, and the water box 25 along with the block plate 24, the inlet manifold 28, the connector 27 and the outlet manifold 26 are placed above the lid plate 21 after the completion of operation S150.

The method S100 also includes operation S160, in which the outlet manifold 26 is fastened to the lid plate 21. In some embodiments, the outlet manifold 26 is fastened to the lid plate 21 by a number of fastening members, such as screws (not shown in figures). The outlet manifold 26 is fastened in a manner of the gas channel C3 in the outlet manifold 26 fluidly connected to the gas channel C2 in the lid plate 21, as shown in FIG. 2.

Figure 11:
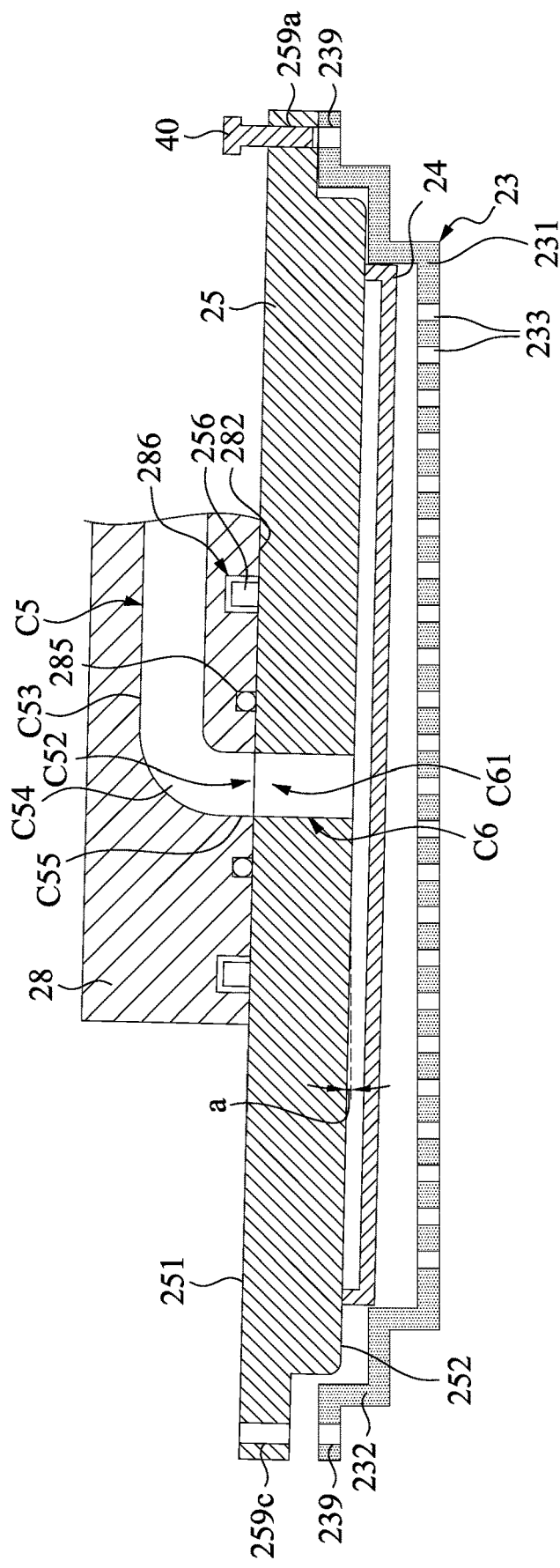
FIG. 11 shows a schematic view of a stage of a method of installing a wafer fabrication tool in which a water box is inclined with respect to a shower head, in accordance with some embodiments.

The method S100 also includes operation S170, in which the water box 25 is fastened to the shower head 23. In some embodiments, operation S170 is performed after operation S160 is finished. After the outlet manifold 26 is fastened to the lid plate 21, the water box 25 may slightly shift toward a position where the outlet manifold 26 and the lid plate 21 is connected, which causes a misalignment of the thread holes 259a, 259b and 259c of the water box 25 relative to the thread holes 239 on the shower head 23. In order to align the two thread holes 259a and 259b with the underlying thread hole 239 and allow screws 40 to connect the two thread holes 259a and 259b with the thread hole 239, the water box 25 is positioned with an inclined angle "a" in relative to the shower head 23, as shown in FIG. 11. The angle "a" may be in a range from 1 degree to 10 degrees.

While the water box 25 is inclined, the two neighboring thread holes 259a and 259b which are adjacent to the outlet manifold 26 are connected with the underlying thread holes 239 prior to the other thread holes 259c by threading two screws 40 into the thread holes 259a and 259b. The two screws 40 are rotated two or three turns and not completed threaded. After the thread holes 259a and 259b are connected to the screws 40, the water box 25 is moved back to its original place (i.e. flat laying on the shower head 23), and the other thread holes 259c are connected to the underlying thread holes 239 by one or more screws 40. Afterwards, all of the screws 40 are manipulated to securely fasten the water box 25 to the shower head 23.

The method S100 also includes operation S180, in which the upper lid 20 is connected to the housing 10. In some embodiments, the upper lid 20 can be connected to the housing 10 through a hinge 13. As a result, the upper lid 20 can be rotated relative to the housing 10. When the upper lid 20 is closed, the gas channel C2 is fluidly connected to the gas channel C1, and the gaseous material from the gas supply line 18 can be uniformly distributed into the process chamber 14 via the gas channels C1-C6 and the shower head 23.

Figure 13:
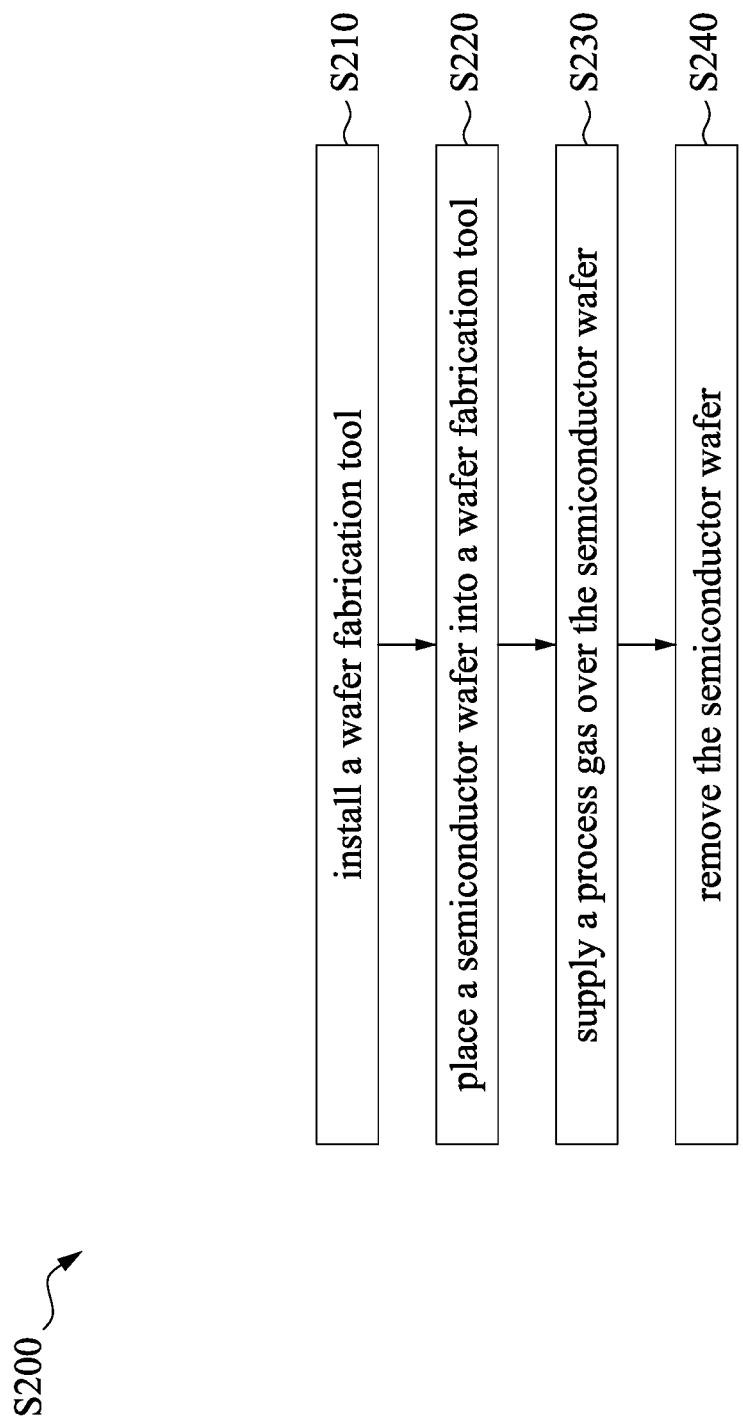
FIG. 13 shows a flow chart of a method of processing a semiconductor wafer with a wafer fabrication tool, in accordance with some embodiments.

FIG. 13 shows a flow chart of a method S200 of processing a semiconductor wafer 5 with the wafer fabrication tool 1, in accordance with some embodiments. Additional operations can be provided before, during, and after the method S200, and some of the operations described can be replaced or eliminated for other embodiments of the method.

The method S200 includes operation S210, in which the wafer fabrication tool 1 is installed. The wafer fabrication tool 1 can be assembled according to the method S100 mentioned above.

The method S200 also includes operation S220, in which a semiconductor wafer 5 is placed into the wafer fabrication tool 1. In some embodiments, the semiconductor wafer 5 is placed on the wafer chuck 12, and the upper lid 20 is closed by rotating the rotation axis R1. The semiconductor wafer 5 placed on the wafer chuck 12 may be fixed by an electrostatic force and heated to an elevated temperate. In some embodiments, after the upper lid 20 is closed, an airtight environment of the process chamber 14 is formed in the wafer fabrication tool 1, and the gas channels C1 is fluidly connected to the gas channel C2. In some embodiments, after the upper lid 20 is closed, a vacuum environment is created in the processing chamber 14 by exhausting air in the process chamber 14.

Figure 12:
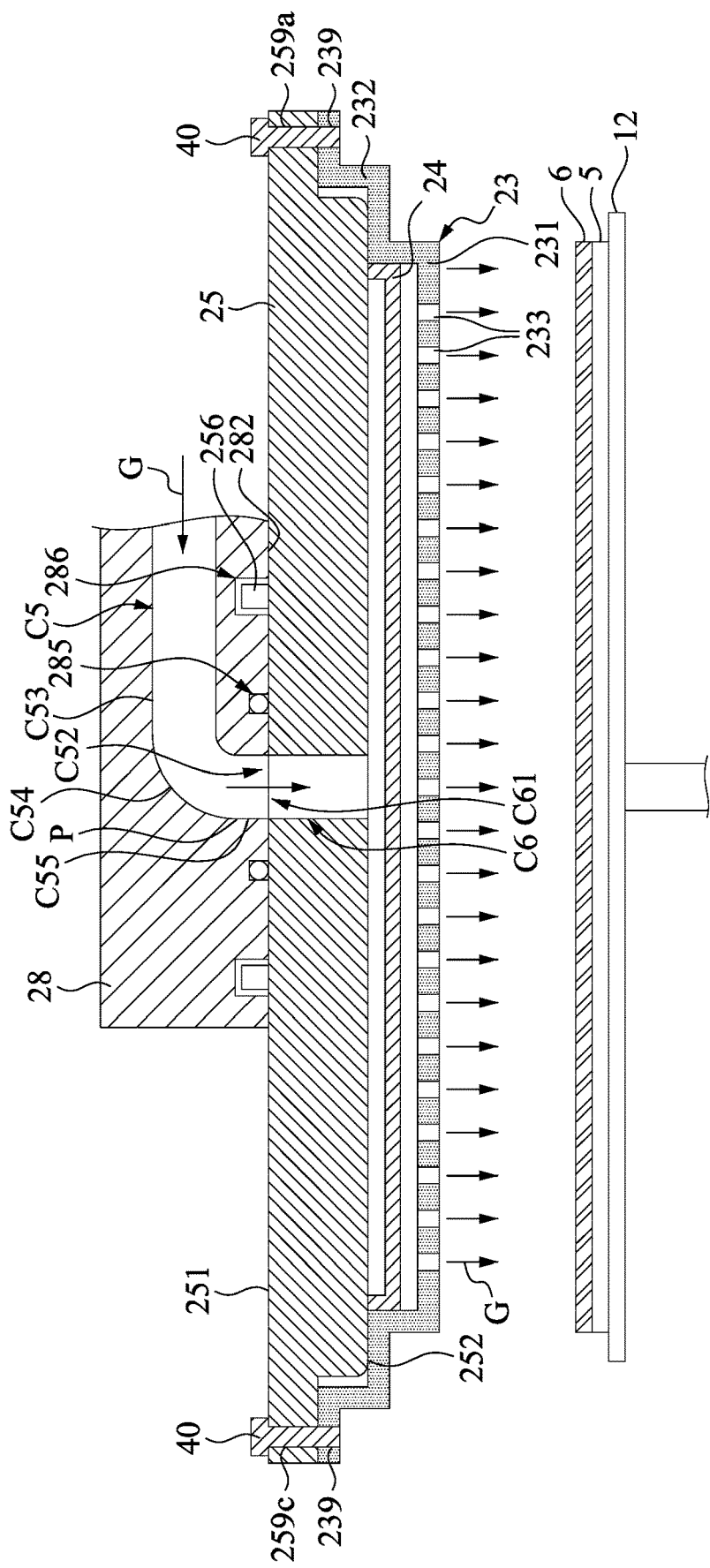
FIG. 12 shows a schematic view of a stage of a method of installing a wafer fabrication tool in which a water box is fixed to a shower head by screws, in accordance with some embodiments.

The method S200 also includes operation S230, in which a process gas G is supplied over the semiconductor wafer 5. In some embodiments, as shown in FIG. 12, the process gas G is supplied over the semiconductor wafer 5 through the gas channels, such as the upper gas channel C5 and the lower gas channel C6 and through the through holes 233 of the shower head 23. It will be appreciated that the collimation of the upper gas channel C5 and the lower gas channel C6 permits the process gas G smoothly passes therethrough without disturbing them, thus enabling the process gas G to be evenly distributed over the semiconductor wafer 5.

In some embodiments, the process gas G is used to form a film 6 on the semiconductor wafer 5. The film 6 deposited on semiconductor wafer5 can be any suitable thin film. Examples of film 6 deposited on semiconductor wafer5 include but are not limited to amorphous silicon (α-Si), polycrystalline silicon, silicon nitride as gate dielectric, silicone dioxide and a metallic layer, such as cobalt. Because the process gas G for forming the film 6 is evenly distributed over the semiconductor wafer 5, the uniformity of the film 6 is improved.

The method S200 also includes operation S240, in which the semiconductor wafer 5 is removed from the wafer fabrication tool 1. In some embodiments, after the film 6 is formed on the semiconductor wafer 5, the semiconductor wafer 5 is removed from the wafer fabrication tool 1. The removal of the semiconductor wafer 5 can be performed after the pressure in the process chamber 14 is returned to atmosphere pressure, and a cleaning gas can be supplied to the process chamber 14 to react or purge residual process gas G. The method S200 may include other operations to complete the process. For example, the method S200 may include a lithography process, including coating resist on the film 6, exposing the resist and developing the exposed resist to form a resist pattern having a plurality of openings defined thereon. The method S200 may further include other operations, such as an operation to perform a fabrication process on the film 6 through the openings of the resist pattern. In one example, the fabrication process includes an etch process on the semiconductor wafer 5 using the resist pattern as an etch mask. In another example, the fabrication process includes an ion implantation process on the semiconductor wafer 5 using the resist pattern as an implantation mask.

Embodiments of the present disclosure provide a method for processing a semiconductor by a fabrication tool. During the assembly of the manifold of the fabrication tool, a jig is used to correctly match two gas channels and reduce turbulence of process gas caused by offset arrangement of gas channels. Since a more uniform distribution of the gaseous material is distributed over the semiconductor wafer, a more uniform processing is likely to occur on the semiconductor wafer being processed.

In accordance with some embodiments, a method of processing a semiconductor wafer is provided. The method includes installing upper lid. The installation of the upper lid includes placing an inlet manifold on a water box; inserting a jig into a lower gas channel in the water box with an end of the jig passing through an upper opening of the lower gas channel and inserting into an upper gas channel in the inlet manifold; fastening the water box to the inlet manifold; removing the jig after the water box engaging with the inlet manifold. The method of processing a semiconductor wafer also includes connecting a shower head on a lower side of the water box; and connecting the upper lid to a housing. The method of processing a semiconductor wafer further includes placing a semiconductor wafer into the housing. In addition, the method of processing a semiconductor wafer includes supplying a process gas over the semiconductor wafer through the upper gas channel, the lower gas channel and the shower head.

In accordance with some embodiments, a method of processing a semiconductor wafer is provided. The method includes installing a semiconductor fabrication tool. The installation of the upper lid includes connecting an inlet manifold, a connector and an outlet manifold to link an upper gas channels formed in the inlet manifold to gas channels formed in the connector and the outlet manifold. The installation of the upper lid also includes placing the inlet manifold with the connector and the outlet manifold on a water box. The installation of the upper lid further includes inserting a jig into a lower gas channel of the water box and the gas channel of the inlet manifold and not removing the jig until the water box is fastened to the inlet manifold. In addition, the installation of the upper lid includes fastening a shower head to a lower side of the water box. The method of processing a semiconductor wafer also includes placing a semiconductor wafer into the housing. The method of processing a semiconductor wafer further includes supplying a process gas over the semiconductor wafer through the upper gas channel, the lower gas channel and the shower head.

In accordance with some embodiments, a semiconductor fabrication tool is provided. The semiconductor fabrication tool is assembled with a use of a jig. The semiconductor fabrication tool includes an inlet manifold having an upper gas channel. The semiconductor fabrication tool also includes a water box connected to the manifold. The water box having a lower gas channel fluidly connected with the upper gas channel. The upper gas channel and the lower gas channel both have a width substantially the same as a width of the jig for facilitating an alignment of the upper gas channel to the lower gas channel. The semiconductor fabrication tool further includes a shower head connected to a lower side of the water box. In addition, the semiconductor fabrication tool includes a wafer stage located below the shower head.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of processing a semiconductor wafer, comprising:
    providing a housing, an inlet manifold of an upper lid, a water box of the upper lid, and a shower head of the upper lid, wherein a pin protrudes from a top surface of the water box, and the inlet manifold has a positioning hole on a bottom-most surface of the inlet manifold;
    installing the upper lid by the following operations:
        placing the inlet manifold on the water box such that the pin is inserted into the positioning hole, wherein the bottom-most surface of the inlet manifold is higher than a bottom-most surface of the water box, and the bottom-most surface of the inlet manifold abuts the top surface of the water box;
        after placing the inlet manifold on the water box, inserting a jig into a lower gas channel in the water box with an end of the jig passing through an upstream opening of the lower gas channel and inserting into an upper gas channel in the inlet manifold, wherein the pin is spaced apart from a sidewall of the positioning hole when the jig is inserted into the lower gas channel and the upper gas channel;
        fastening the water box to the inlet manifold;
        removing the jig after the water box is fastened to the inlet manifold; and
        fastening the water box to the shower head;
    after installing the upper lid, placing the upper lid on the housing;
    connecting the upper lid to the housing;
    placing a semiconductor wafer into the housing; and supplying a process gas over the semiconductor wafer through the upper gas channel, the lower gas channel and the shower head.

2. The method as claimed in claim 1, further comprising placing an O-ring between the water box and the inlet manifold, wherein a center of the O-ring aligns with the lower and the upper gas channels.

3. The method as claimed in claim 1, wherein the water box is fastened to the inlet manifold while the jig stays in the upper gas channel and the lower gas channel.

4. The method as claimed in claim 1, wherein the water box is fastened to the shower head after the jig is removed from the upper gas channel and the lower gas channel.

5. The method as claimed in claim 1, further comprising:
engaging the inlet manifold with a connector to have a gas channel of the connector connected with an upstream opening of the upper gas channel;
engaging the connector with an outlet manifold to have a gas channel of the outlet manifold connected with the gas channel of the connector; and
fastening the outlet manifold to a lid plate to have the gas channel of the outlet manifold connect with a gas channel formed on the lid plate.

6. The method as claimed in claim 5, further comprising:
placing the shower head on the lid plate before fastening the shower head to the water box; and
wherein the shower head is fastened to the water box through a plurality of screws, and the screws are connected to thread holes on the shower head in an order that a first of the thread holes that is next to the outlet manifold is connected to a first of the screws earlier than other thread holes.

7. The method as claimed in claim 6, wherein when the first of the thread holes is connected to the first of the screws, the water box is placed inclined relative to the shower head.

8. The method as claimed in claim 1, wherein when the jig is inserted into the upper gas channel, the end of the jig abuts against a curved segment of the upper gas channel.

9. The method as claimed in claim 1, wherein when the jig is inserted into the upper gas channel, a center of a downstream opening of the upper gas channel aligns with a center of the upstream opening of the lower gas channel.

10. The method as claimed in claim 1, wherein when the jig is inserted into the upper gas channel, an inner wall of the upper gas channel is flush with an inner wall of the lower gas channel, and a bottom edge of the inner wall of the upper gas channel is no lower than a top edge of the inner wall of the lower gas channel.

11. A method of processing a semiconductor wafer, comprising:
providing a housing, an inlet manifold of an upper lid, a connector of the upper lid, an outlet manifold of the upper lid, a water box of the upper lid, and a shower head of the upper lid;
installing the upper lid by the following operations:
connecting the inlet manifold, the connector and the outlet manifold to link an upper gas channel formed in the inlet manifold to gas channels formed in the connector and the outlet manifold;
placing the inlet manifold with the connector and the outlet manifold on the water box, wherein the water box has a lower gas channel, the upper gas channel comprises a first segment extending in a first direction substantially parallel to a top surface of the water box, a second segment extending in a second direction substantially perpendicular to the top surface of the water box, and a third segment which is curved and interconnects the first segment and the second segment;
inserting a jig into the lower gas channel of the water box and the upper gas channel of the inlet manifold until an end of the jig abuts the third segment of the upper gas channel of the inlet manifold;
fastening the water box to the inlet manifold;
removing the jig from the upper gas channel of the inlet manifold and the lower gas channel of the water box, after fastening the water box to the inlet manifold; and
fastening the shower head to the water box;
connecting the upper lid to the housing;
placing a semiconductor wafer into the housing; and
supplying a process gas over the semiconductor wafer through the upper gas channel, the lower gas channel and the shower head.

12. The method as claimed in claim 11, further comprising placing an O-ring between the water box and the inlet manifold, wherein a center of the O-ring aligns with the lower and the upper gas channels.

13. The method as claimed in claim 11, further comprising:
placing the shower head on a lid plate before fastening the shower head to the water box; and
fastening the outlet manifold to the lid plate, wherein the shower head is fastened to the water box through a plurality of screws, and the screws are connected to thread holes on the shower head in an order that a first of the thread holes that is next to the outlet manifold is connected to a first of the screws earlier than other thread holes.

14. The method as claimed in claim 13, wherein when the first of the thread holes is connected to the first of the screws, the water box is placed inclined relative to the shower head.

15. The method of claim 1, further comprising fastening a block plate to the water box after the jig is removed from the upper gas channel and the lower gas channel and prior to fastening the water box to the shower head.

16. A method of processing a semiconductor wafer, comprising:
providing an inlet manifold of an upper lid, a water box of the upper lid, a block plate of the upper lid, and a shower head of the upper lid;
installing the upper lid by the following operations:
placing the inlet manifold on water box, wherein the inlet manifold has an inner wall that defines an upper gas channel, the water box has an inner wall that defines a lower gas channel, and the inner wall of the inlet manifold that defines the upper gas channel and the inner wall of the water box that defines the lower gas channel are free from overlapping when viewed in a horizontal direction that is substantially parallel to a top surface of the water box;
inserting a first portion of a jig into the upper gas channel;
inserting a second portion of the jig into the lower gas channel;
after inserting the first portion of the jig into the upper gas channel in the inlet manifold and inserting the second portion of the jig into the lower gas channel in the water box, fastening the water box to the inlet manifold;
removing the jig from the inlet manifold and the water box;

after removing the jig from the inlet manifold and the water box, fastening the block plate to the water box, wherein the block plate comprises a supporting ring and a membrane connected to a lower edge of the support ring; and after fastening the block plate to the water box, fastening the water box to the shower head, wherein a bottom-most surface of the block plate is higher than a bottom-most surface of the shower head;

placing a semiconductor wafer under the upper lid; and supplying a process gas over the semiconductor wafer through the upper gas channel, the lower gas channel and the shower head.

17. The method of claim 16, wherein the first portion of the jig has a width slightly greater than a diameter of the first portion of the jig before the first portion of the jig is inserted into the upper gas channel, and inserting the first portion of the jig into the upper gas channel comprises squeezing the first portion of the jig into the upper gas channel.

18. The method of claim 16, wherein the second portion of the jig has a width slightly greater than a diameter of the second portion of the jig before the second portion of the jig is inserted into the lower gas channel, and inserting the second portion of the jig into the lower gas channel comprises squeezing the second portion of the jig into the lower gas channel.

19. The method of claim 16, wherein the jig is made of polytetrafluoroethene (PTFE).

20. The method of claim 16, wherein the block plate is suspended above a lower wall of the shower head.

* * * * *